United States Patent
Wei et al.

(10) Patent No.: US 9,105,507 B2
(45) Date of Patent: Aug. 11, 2015

(54) METHODS OF FORMING A FINFET SEMICONDUCTOR DEVICE WITH UNDOPED FINS

(71) Applicant: GLOBALFOUNDRIES Inc., Grand Cayman (KY)

(72) Inventors: Andy C. Wei, Queensbury, NY (US); Akshey Sehgal, Malta, NY (US); Seung Y. Kim, North Andover, MA (US); Teck Jung Tang, Ballston Lake, NY (US); Francis M. Tambwe, Malta, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/595,924

(22) Filed: Jan. 13, 2015

(65) Prior Publication Data

US 2015/0123214 A1   May 7, 2015

Related U.S. Application Data

(62) Division of application No. 13/711,779, filed on Dec. 12, 2012, now Pat. No. 8,969,932.

(51) Int. Cl.
| | |
|---|---|
| *H01L 29/76* | (2006.01) |
| *H01L 29/10* | (2006.01) |
| *H01L 27/088* | (2006.01) |

(52) U.S. Cl.
CPC ........ *H01L 29/1083* (2013.01); *H01L 27/0886* (2013.01)

(58) Field of Classification Search
CPC .................................................... H01L 29/785

USPC ......................................................... 257/288
See application file for complete search history.

(56) References Cited

U.S. PATENT DOCUMENTS

| | | | |
|---|---|---|---|
| 4,835,112 | A | 5/1989 | Pfiester et al. |
| 6,534,388 | B1 | 3/2003 | Lin et al. |
| 7,838,887 | B2 | 11/2010 | Woon et al. |
| 8,013,372 | B2 | 9/2011 | Liu et al. |
| 8,674,413 | B1 | 3/2014 | Chi |
| 2003/0228476 | A1 | 12/2003 | Buhay et al. |
| 2005/0054164 | A1 | 3/2005 | Xiang |
| 2011/0027955 | A1 | 2/2011 | Woon et al. |
| 2011/0309447 | A1 | 12/2011 | Arghavani et al. |
| 2012/0251819 | A1 | 10/2012 | Buhay et al. |
| 2013/0043536 | A1* | 2/2013 | Rahim et al. .................. 257/347 |

* cited by examiner

*Primary Examiner* — Charles Garber
*Assistant Examiner* — Ankush Singal
(74) *Attorney, Agent, or Firm* — Amerson Law Firm, PLLC

(57) ABSTRACT

A FinFET device includes a plurality of fin structures positioned in and above a semiconducting substrate, wherein each of the fin structures includes a first portion of the semiconducting substrate, an undoped layer of semiconducting material positioned above the first portion of the semiconducting substrate, and a dopant-containing layer of semiconducting material positioned between the first portion of the semiconducting substrate and the undoped semiconducting material, wherein the dopant material is adapted to retard diffusion of one of boron and phosphorous. A gate electrode is positioned around at least the undoped layer of semiconducting material of each of the plurality of fin structures, wherein a height level of a bottom surface of the gate electrode is positioned approximately level with or lower than a height level of a bottom of the undoped layer of semiconducting material of each of the plurality of fin structures.

20 Claims, 6 Drawing Sheets

US 9,105,507 B2

METHODS OF FORMING A FINFET SEMICONDUCTOR DEVICE WITH UNDOPED FINS

CROSS-REFERENCE TO RELATED APPLICATION

This is a divisional of co-pending application Ser. No. 13/711,779, filed Dec. 12, 2012.

BACKGROUND OF THE INVENTION

1. Field of the Invention

Generally, the present disclosure relates to the manufacture of sophisticated semiconductor devices, and, more specifically, to various methods of forming a FinFET semiconductor device with undoped fins.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a device that typically includes a source region, a drain region, a channel region that is positioned between the source region and the drain region, and a gate electrode positioned above the channel region. Current flow through the FET is controlled by controlling the voltage applied to the gate electrode. If a voltage that is less than the threshold voltage of the device is applied to the gate electrode, then there is no current flow through the device (ignoring undesirable leakage currents, which are relatively small). However, when a voltage that is equal to or greater than the threshold voltage of the device is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the channel from being adversely affected by the electrical potential of the drain. This is sometimes referred to as a so-called short channel effect, wherein the characteristic of the FET as an active switch is degraded.

In contrast to a planar FET, which has a planar structure, there are so-called 3D devices, such as an illustrative FinFET device, which is a 3-dimensional structure. More specifically, in a FinFET, a generally vertically positioned, fin-shaped active area is formed and a gate electrode encloses both of the sides and the upper surface of the fin-shaped active area to form a tri-gate structure so as to use a channel having a 3-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the depletion width under the channel and thereby reduce so-called short channel effects. Also, in a FinFET, the junction capacitance at the drain region of the device is greatly reduced, which tends to reduce at least some short channel effects.

However, FinFET devices still exhibit some performance-limiting characteristics. One such characteristic that is detrimental to all forms of semiconductor devices, both FinFETs and planar FETs, is off-state leakage currents. Ideally, off-state leakage current is minimized to increase device performance. In the case of a FinFET device, it has been noted that the punch-through leakage current densities vary along the vertical length of the fins with the current densities being much greater at the bottom of the fins proximate the local isolation regions of the device. See, e.g., Okano et al., "Process Integration Technology and Device Characteristics of CMOS FinFET on Bulk Silicon Substrate with sub-10 nm Fin Width and 20 nm Gate Length," *IEDM Technical Digest*, pp. 721-724, 2005. Efforts have been made in the past in attempts to reduce such punch-through leakage currents in FinFET devices. For example, in some cases, efforts have been made to form so-called "punch-stop" implant regions at the base of the fins by implanting ions into the bottom portion of the fins. Unfortunately, such punch-stop implant regions increase the dopant present at the bottom of the fin as compared to the amount of dopant present in the middle or top of the fin. As a result of the variation in doping levels of the fin, the bottom portion of the fin has a higher threshold voltage ($V_t$) as compared to the middle portion and/or top portion of the fin. Thus, in operation, the bottom portion of the fin does not turn "ON" when the middle and top portion of the fin is turned "ON." The net result is that the bottom portion of the fin does not produce any desirable drive current, yet it does present an undesirable, performance-limiting capacitance that is charged and discharged in every operational cycle of the FinFET device.

The present disclosure is directed to various methods of forming FinFET semiconductor devices that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various FinFET semiconductor devices with undoped fins and methods for forming the same. In one exemplary embodiment disclosed herein, a FinFET device includes a plurality of fin structures positioned in and above a semiconducting substrate, wherein each of the plurality of fin structures includes, among other things, a first portion of the semiconducting substrate, an undoped layer of semiconducting material positioned above the first portion of the semiconducting substrate, and a dopant-containing layer of semiconducting material positioned between the first portion of the semiconducting substrate and the undoped semiconducting material, wherein the dopant material is adapted to retard diffusion of one of boron and phosphorous. The illustrative FinFET device further includes a gate electrode positioned around at least the undoped layer of semiconducting material of each of the plurality of fin structures, wherein a height level of a bottom surface of the gate electrode is positioned approximately level with or lower than a height level of a bottom of the undoped layer of semiconducting material of each of the plurality of fin structures.

Another exemplary FinFET device in accordance with a further illustrative embodiment of the present disclosure includes, among other things, a plurality of fin structures positioned in and above a semiconducting substrate and a gate electrode structure positioned around at least a portion of each of the plurality of fins. Each of the plurality of fin structures includes a first fin portion, a second fin portion positioned on the first fin portion, a third fin portion positioned above the second fin portion, and a fourth fin portion positioned on the third fin portion. The first and second fin portions include a first semiconducting material and a first dopant material having a first conductivity type, wherein a first concentration of the first dopant material in the first fin portion is lower than a second concentration of the first dopant material in the second fin portion. Furthermore, the third fin portion includes a second semiconducting material and a second dopant material, wherein the second dopant material is adapted to retard diffusion of at least one of boron and phosphorous, and the fourth fin portion includes an undoped third semiconducting material. Additionally, the gate electrode structure includes a gate insulation layer and a gate electrode positioned on the gate insulation layer, wherein a height level of a bottom surface of the gate electrode structure is positioned no higher than a height level of a bottom of the third fin portions of each of the plurality of fin structures.

BRIEF DESCRIPTION OF THE DRAWINGS

The disclosure may be understood by reference to the following description taken in conjunction with the accompanying drawings, in which like reference numerals identify like elements, and in which.

Figure 1A:
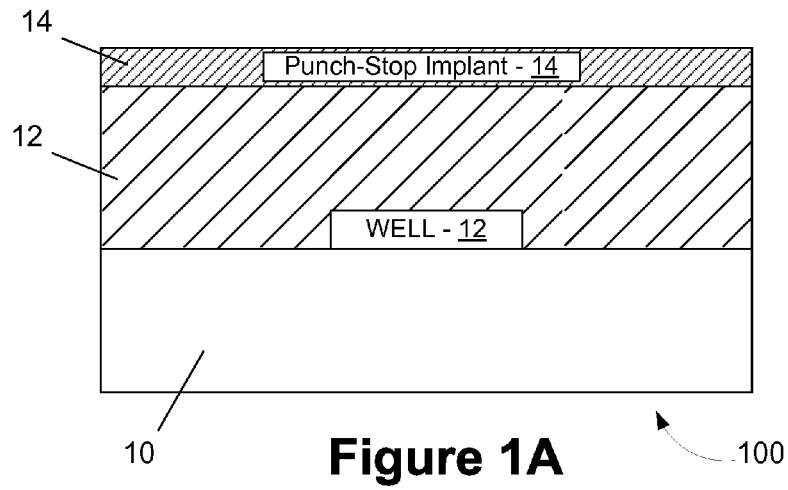
FIGS. 1A-1L depict one illustrative method disclosed herein of forming a three-dimensional (3D) semiconductor device, such as, for example, a FinFET semiconductor device, with undoped fins.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming a FinFET semiconductor device with undoped fins. As will be readily apparent to those skilled in the art upon a complete reading of the present application, the methods disclosed herein may be employed in manufacturing a variety of different devices, including, but not limited to, logic devices, memory devices, etc. With reference to the attached figures, various illustrative embodiments of the methods and devices disclosed herein will now be described in more detail.

FIG. 1A is a simplified view of an illustrative FinFET semiconductor device 100 at an early stage of manufacturing that is formed above a semiconducting substrate 10. The substrate 10 may have a variety of configurations, such as the depicted bulk silicon configuration. The substrate 10 may be made of silicon or it may be made of materials other than silicon. Thus, the terms "substrate" or "semiconducting substrate" should be understood to cover all semiconducting materials.

In general, the present disclosure is directed to a novel method of forming fins for a FinFET semiconductor device prior to forming isolation structures, such as trench isolation structures, in the substrate 10. Initially, a plurality of alignment marks (not shown) are formed in the substrate by etching the marks into the substrate through a patterned etch mask, such as a patterned layer of photoresist material. The alignment marks, as the name implies, will be used to accurately position the location of various doped regions and structures that will be formed in and above the substrate 10, as described more fully below. The alignment marks may be any type of alignment mark that may be employed in manufacturing semiconductor devices and they may be of any style or configuration (e.g., a cross, a chevron pattern, etc.). The number and location of the alignment marks may vary depending on the particular application and/or the device 100 under construction. For example, the alignment marks may be located in the scribe lines (not shown) of the substrate 10 or they may be located on one or more of the die (not shown) that are on the substrate 10, or a combination of such locations. As one example, four of the illustrative alignment marks may be provided for every "flash-field" that will be employed during photolithography operations that are performed in manufacturing the device 100. Thus, the presently disclosed inventions should not be considered as limited to any particular type, size, number or configuration of alignment marks, nor to the way such alignment marks are made or positioned.

With continuing reference to FIG. 1A, after the alignment marks have been formed in the substrate 10, various ion implantation processes are performed to define a doped well region 12 and a punch-stop implant region 14 in the substrate 10. The type of dopant used in forming the well region 12 and the punch-stop implant region 14 depends on the type of FinFET device under construction. For an N-type FinFET device 100, the well region 12 and the punch-stop implant region 14 will be doped with a P-type dopant material. Conversely, for a P-type FinFET device 100, the well region 12 and the punch-stop implant region 14 will be doped with an N-type dopant material. The amount of dopant and the depth of the doped regions 12, 14 may vary depending upon the particular application, although the punch-stop implant region 14 will typically have a higher dopant concentration than that of the nominal well region 12. In one illustrative example, the well region 12 may have a dopant concentration of about 1-5 $e^{13}$ ions/cm$^3$, while the punch-stop implant region 14 may have a dopant concentration of about 1-5 $e^{13}$ ions/cm$^3$. The doped regions 12, 14 may be formed by performing known ion implant processes through a patterned implant mask, e.g., a patterned photoresist mask (not shown), using known ion implantation tools and techniques.

Figure 1B:
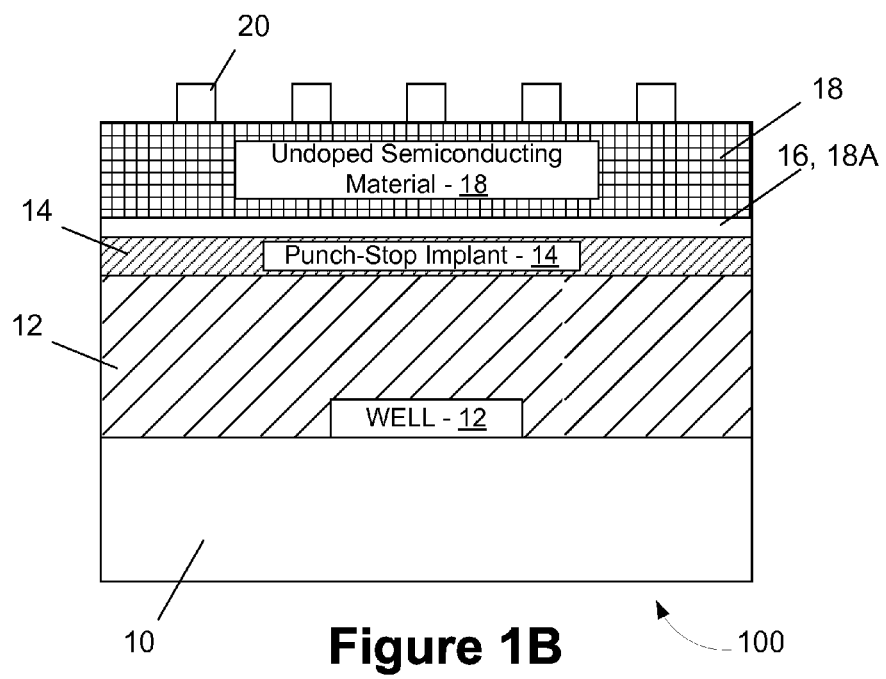

As shown in FIG. 1B, in one illustrative embodiment, a portion of the substrate 10 is converted into a dopant-containing region 16 comprised of a dopant that retards the diffusion of boron and/or phosphorus, e.g., at least one of, for example, carbon and/or germanium may be used to form the dopant-containing region 16. One technique that may be employed to introduce the dopant material(s), e.g., carbon, into the substrate 10 is a plasma doping technique. The concentration of dopant in the dopant-containing region 16, as well as the depth of the dopant-containing region 16, may vary depending upon the particular application. In one illustrative example, where carbon is the dopant material, the dopant-containing region 16 may have a depth of about 5 nm and a carbon concentration that is greater than approximately 2% (in the silicon lattice structure) after the plasma doping process. Thereafter, if desired, an anneal process at a temperature greater than about 900° C. may be performed to drive the carbon to interstitial positions in the silicon substrate 10.

Next, an undoped semiconducting material layer 18 is formed above the dopant-containing region 16. The semiconductor material layer 18 may be comprised of a variety of different materials, such as, for example, silicon, a doped silicon, silicon germanium, a III-V material, etc., and it may be formed to any desired thickness using any acceptable process, e.g., an epitaxial growth process. In one illustrative embodiment, the semiconducting material layer 18 is an undoped layer of silicon with a thickness of about 20-50 nm. As will be appreciated by those skilled in the art after a complete reading of the present application, the height of the semiconducting material layer 18 will generally correspond to the final fin height of the fins for the device 100. Thus, the thickness of the semiconducting material layer 18 may be adjusted depending upon the desired final height of the fins for the device 100. As an alternative, instead of performing the aforementioned plasma doping process to form the dopant-containing region 16 in the substrate 10, the dopant material may be introduced during the initial stages of forming the semiconducting material layer 18 to effectively form a dopant-rich portion of the semiconducting material layer 18. Thus, in FIG. 1B, the dopant-containing region is labeled with dual reference numbers—"16" and "18A" to reflect these two alternative embodiments. If desired, both techniques could be employed in manufacturing the device 100. Throughout the remainder of this specification and in the claims, the description "dopant-containing region 16" will be employed to describe both of these alternative arrangements. Additionally, when it is stated herein that the semiconducting material layer 18 is "undoped," it means that it is not intentionally doped with either a P-type or N-type dopant material. However, as noted, at least portions of the semiconducting material layer 18 may be doped with materials other than a P-type or N-type dopant, such as carbon (to form the dopant-containing region 16 as described above). It should be understood that very small amounts of N- or P-type dopants may be present in the undoped semiconducting material layer 18 as a result of incidental processing or contamination during the fabrication of the device 100, but the semiconducting material layer 18 should still be considered to be "undoped" as that term is used herein and in the claims.

With continuing reference to FIG. 1B, a patterned mask layer 20, such as a patterned hard mask layer, is formed above the semiconducting material layer 18. The patterned mask layer 20 is intended to be representative in nature as it could be comprised of a variety of materials, such as, for example, a photoresist material, silicon nitride, silicon oxynitride, silicon dioxide, a metal oxide, etc. Moreover, the patterned mask layer 20 could be comprised of multiple layers of material, such as, for example, a combination of a silicon nitride layer and a layer of silicon dioxide. The patterned mask layer 20 may be formed by depositing the layer of material 20 and directly patterning the layer 20 using known photolithography and etching techniques. Alternatively, the patterned mask layer 20 may be formed by using known sidewall image transfer techniques. Thus, the particular form and composition of the patterned mask layer 20 and the manner in which it is made should not be considered a limitation of the present invention. In the case where the patterned mask layer 16 is comprised of one or more hard mask layers, such layers may be formed by performing a variety of known processing techniques, such as a chemical vapor deposition (CVD) process, an atomic layer deposition (ALD) process, an epitaxial deposition process (EPI), or plasma enhanced versions of such processes, and the thickness of such a layer(s) may vary depending upon the particular application. In one illustrative embodiment, the patterned mask layer 20 is a hard mask layer of silicon nitride that is initially formed by performing a CVD process and thereafter patterned using known sidewall image transfer techniques and/or photolithographic techniques, combined with performing known etching techniques.

Figure 1C:
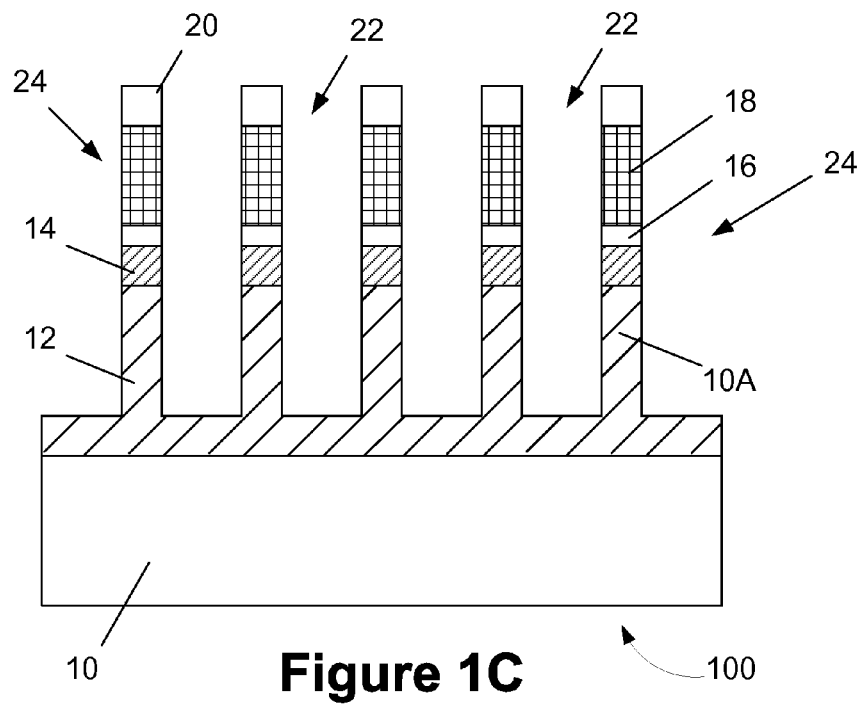

Next, as shown in FIG. 1C, one or more etching processes, such as a plurality of dry or wet etching processes, are performed through the patterned mask layer 20 to form a plurality of trenches 22. This etching process results in the definition of a plurality of overall fin structures 24. In the depicted example, the overall fin structure 24 is comprised of a portion 10A of the substrate 10, the undoped semiconducting material 18 positioned above the portion 10A of the substrate 10 and the dopant-containing layer 16 positioned between the undoped semiconducting material 18 and the portion 10A of the substrate 10. The overall size, shape and configuration of the trenches 22 and the fin structures 24 may vary depending on the particular application. The depth and width of the trenches 22 may vary depending upon the particular application. In one illustrative embodiment, based on current day technology, the depth of the trenches 22 may range from approximately 100-300 nm and the width of the trenches 22 may range from about 15-80 nm. In some embodiments, the fins 18 may have a width within the range of about 10-30 nm.

In the illustrative example depicted in the attached figures, the trenches 22 and the fins 18 are all of a uniform size and shape. However, as discussed more fully below, such uniformity in the size and shape of the trenches 22 and the fins 18 is not required to practice at least some aspects of the inventions disclosed herein. In the example depicted herein, the trenches 22 are depicted as having been formed by performing a plurality of anisotropic etching processes that result in the trenches 22 having a schematically depicted, generally rectangular configuration. In an actual real-world device, the sidewalls of the trenches 22 may be somewhat inwardly tapered, although that configuration is not depicted in the drawings. In some cases, the trenches 22 may have a reentrant profile near the bottom of the trenches 22. To the extent the trenches 22 are formed by performing a wet etching process, the trenches 22 may tend to have a more rounded configuration or non-linear configuration as compared to the generally rectangular configuration of the trenches 22 that are formed by performing an anisotropic etching process. Thus, the size and configuration of the trenches 22, and the manner in which they are made, should not be considered a limitation of the present invention. For ease of disclosure, only the substantially rectangular trenches 22 will be depicted in subsequent drawings.

Figure 1D:
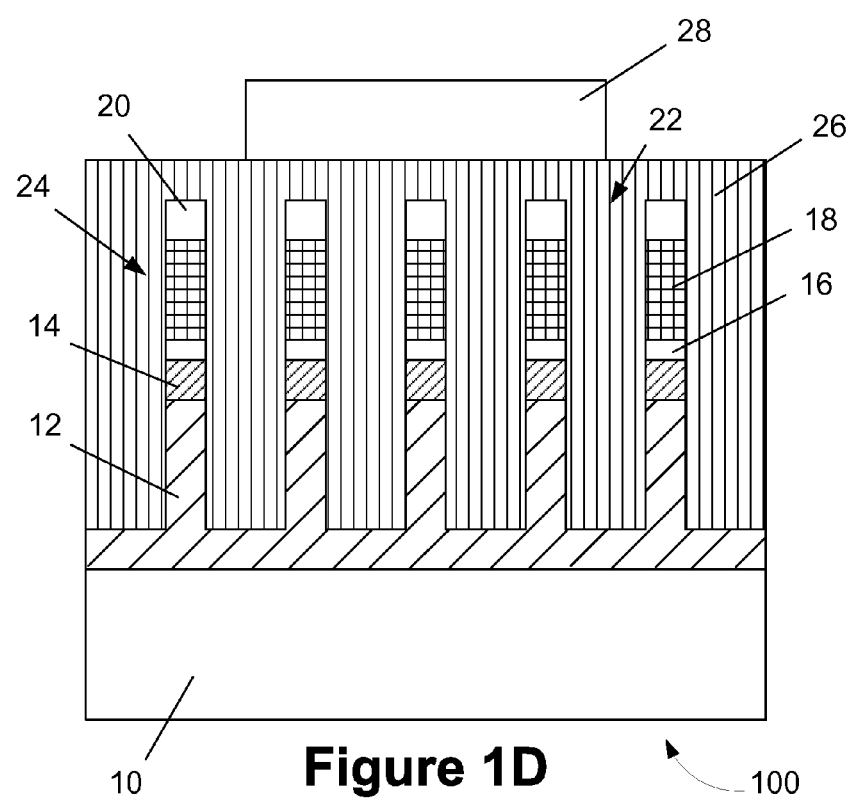

Next, as shown in FIG. 1D, a layer of material 26 is formed on the device so as to overfill the trenches 22 and a patterned etch mask 28 is formed above the layer of material 26. In one illustrative embodiment, the layer of material 26 is an OPL material layer that is formed by performing a spin-on coating process. The patterned etch mask 28 may be a patterned layer of photoresist material that is formed using traditional photolithography tools and techniques.

Figure 1E:
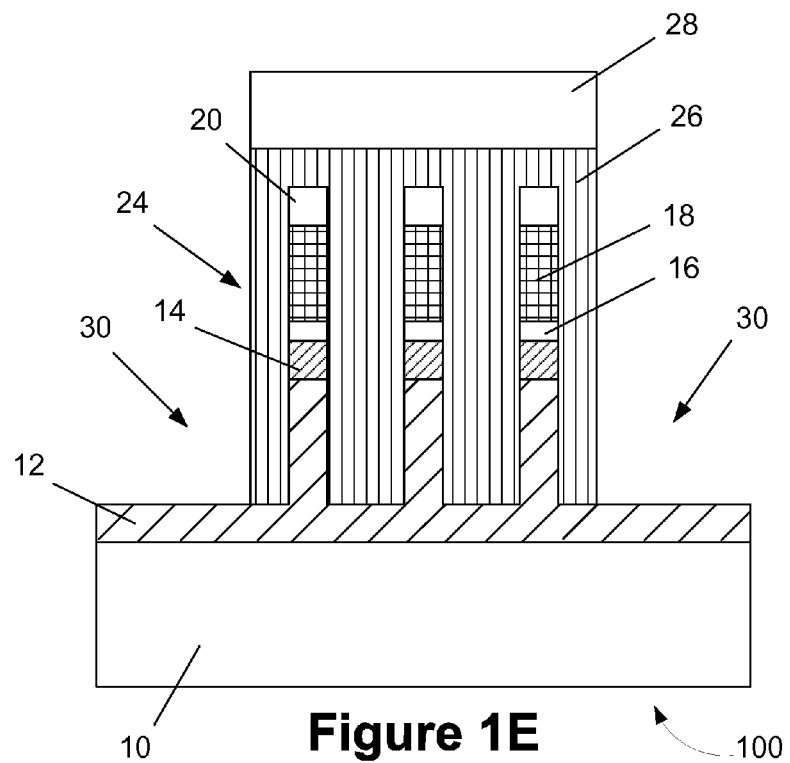

Next, as shown in FIG. 1E one or more etching processes, such as dry, anisotropic etching processes, are performed through the etch mask 28 to remove exposed portions of the layer of material 26 and certain of the fin structures 24 that are not covered by the etch mask 28. These etching processes effectively define enlarged regions or cavities 30 where isolation regions (not shown in FIG. 1E) will be formed to electrically isolate the device 100 from adjacent devices that are formed on the substrate 10. In the depicted example, the two outermost fin structures 24 may be considered to be sacrificial in nature in that they were formed in an effort to insure more accurate formation of the fins 24 that will be part of the final device. However, the formation of such sacrificial fin structures may not be required in all applications and the formation of such sacrificial fin structures should not be considered to be a limitation of the presently disclosed inventions.

Figure 1F:
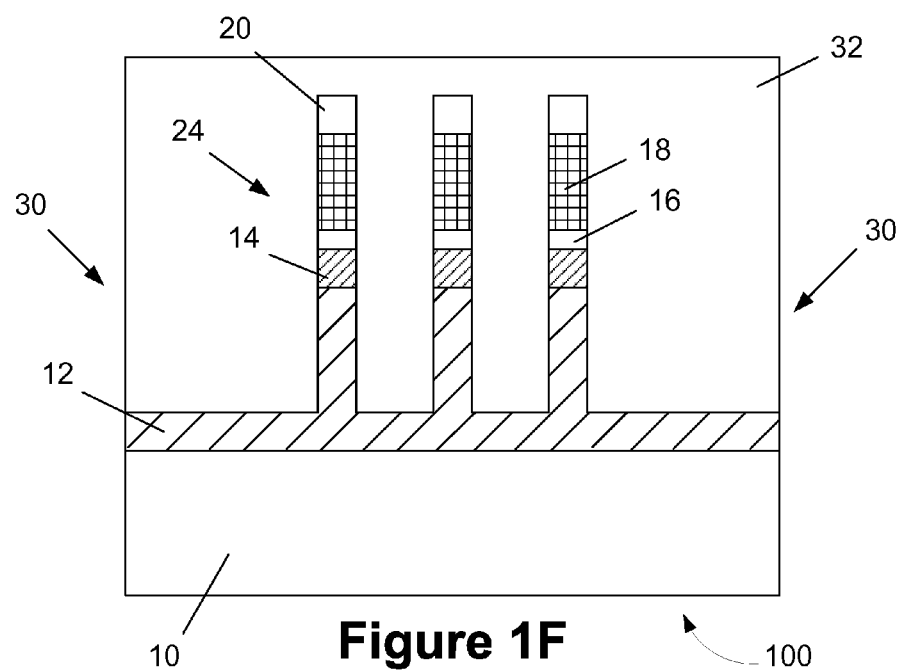

FIG. 1F depicts the device 100 after several process operations have been performed. Initially, the patterned etch mask 28 and the layer of material 26 depicted in FIG. 1E are removed using known techniques, e.g., ashing and/or a solvent rinse. Next, a layer of insulating material 32 is formed so as to overfill the trenches 22, as depicted in FIG. 1F. In one illustrative embodiment, the layer of insulating material 32 may be a flowable oxide material, a spin-on-glass material, etc. In one particularly illustrative embodiment, the layer of insulating material 32 is a flowable oxide material that is formed and cured by performing a steam anneal process at a temperature of about 500° C.

Figure 1G:
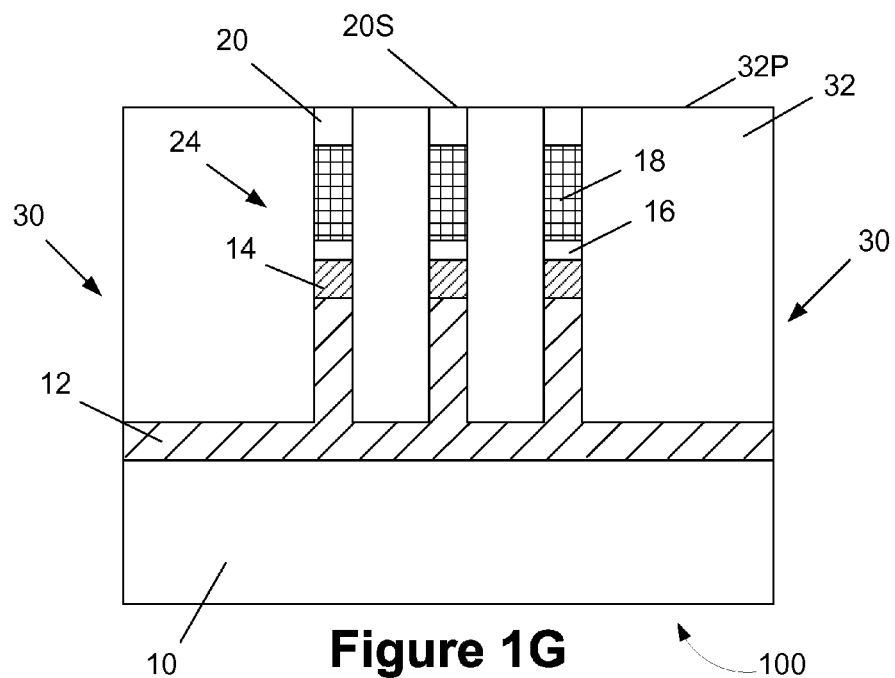

FIG. 1G depicts the device 100 after a chemical mechanical polishing (CMP) process has been performed on the layer of insulating material 32 that stops on the hard mask layer 20. This CMP process results in the layer of insulating material 32 having a polished surface 32P that is substantially planar with the upper surface 20S of the hard mask layer 20. In one illustrative embodiment, the CMP process may be performed using a Ceria-based slurry. However, it should be noted that if the flowable oxide CVD process or SOG process is sufficiently planarizing, the above-described CMP process may not be required and removal of portions of the layer of insulating material 32 may proceed directly after the insulating material 32 is formed on the device 100.

Figure 1H:
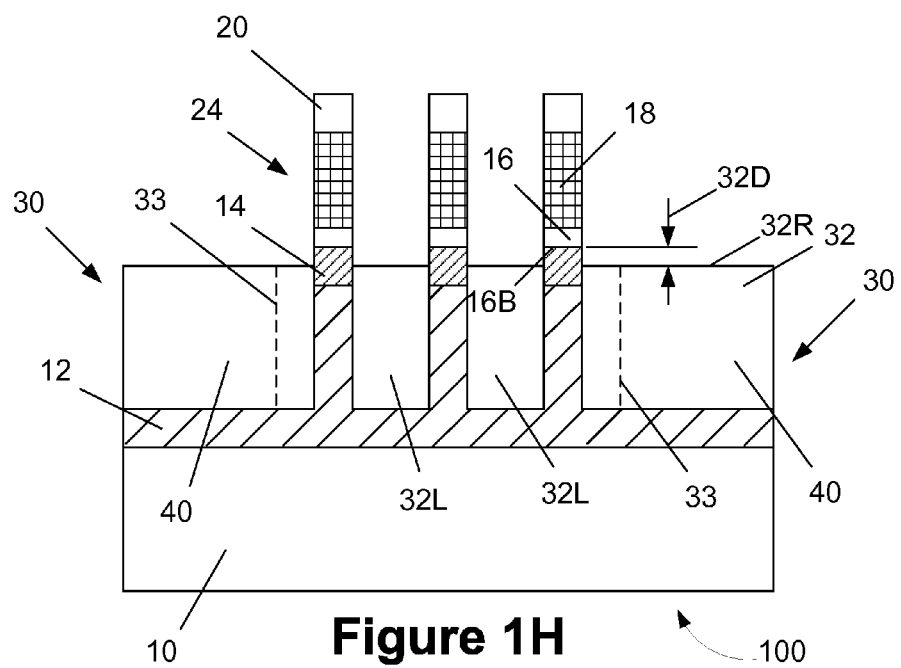

Then, as shown in FIG. 1H, a material removal process, such as an etching process, is performed on the layer of insulating material 32 to reduce its overall thickness and thereby define a reduced thickness layer of insulating material 32 having an upper surface 32R. This process results in the formation of a plurality of local isolation regions 32L and the device isolation region 40 (the inner boundary of which is approximately indicted by the dashed lines 33). That is, the local isolation regions 32L and the device isolation regions 40 are formed from the same layer of insulating material in a common deposition, polish (if required) and recess etch process sequence. The final thickness of the reduced thickness layer of insulating material 32 may vary depending upon the particular application, e.g., it may have a reduced thickness of about 100-200 nm. In one illustrative embodiment, the material removal process is a highly-controllable atomic layer removal process that may be performed using SiCoNi or the well-known COR process from Tokyo Electron. In one example, this removal process should be controlled such that the upper surface 32R of the reduced thickness layer of insulating material 32 is positioned below the bottom surface 16B of the dopant-containing layer 16 by a distance 32D that is equal to or greater than the thickness of the gate insulation layer that will be subsequently formed for the device. In the depicted example, the upper surface 32R of the reduced thickness layer of insulating material 32 is positioned such that substantially all of the dopant-containing region 16 is exposed as well as a portion of the punch-stop implant region 14. As will be appreciated by those skilled in the art after a complete reading of the present application, the upper surface 32R of the reduced thickness layer of insulating material 32 effectively defines the final fin height for the device 100.

Figure 1I:
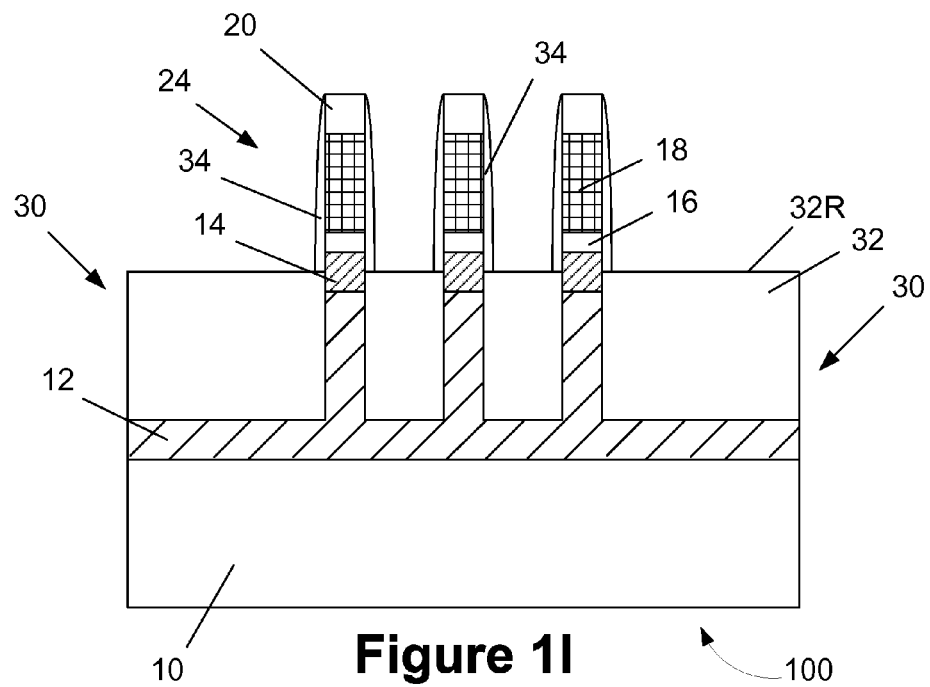

In some embodiments, additional process operations may be performed on the device to enhance the etch resistance of the reduced thickness layer of insulating material 32, although such processes are not required to practice at least some aspects of some of the inventions disclosed herein. In on illustrative embodiment, as shown in FIG. 1I, sidewall spacers 34 are formed adjacent the exposed fins 24. The sidewall spacers 34 may be comprised of, for example, silicon nitride, and they may have a base thickness of about 1-3 nm. The spacers 34 may be formed by depositing a layer of spacer material and thereafter performing an anisotropic etching process to define the spacers 34 using known techniques.

Figure 1J:
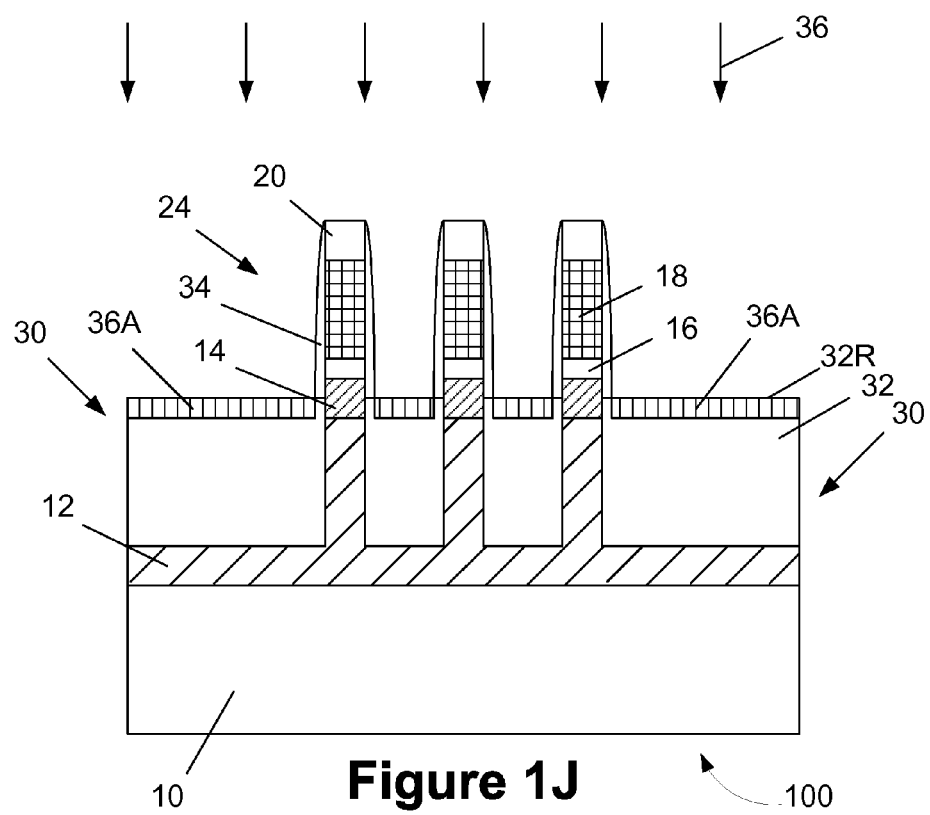

Next, as shown in FIG. 1J, a process operation 36 is performed to form etch-resistant regions 36A in the reduced thickness layer of insulating material 32. In one illustrative example, the process 36 is a plasma doping process and may be performed using atoms of silicon, carbon, etc. to form the etch-resistant regions 36A. The concentration of silicon or carbon in the regions 36A, as well as the depth of the regions 36A, may vary depending upon the particular application. In one illustrative example, the etch-resistant regions 36A may have a depth of about 10-20 nm. In the case where carbon is employed to form the etch-resistant regions 36A, the carbon concentration may be about 10-20% (in silicon dioxide) to form a carbon-rich silicon dioxide. In the case where silicon is employed to form the etch-resistant regions 36A, the silicon concentration may be about 10-20% (in silicon dioxide) to form a silicon-rich silicon dioxide. In this illustrative example, the etch-resistant regions 36A have a target depth of about 10-20 nm. The purpose of the etch-resistant regions 36A is to change the wet etch resistance of the layer of insulating material 32. Carbon or silicon will form a network of strong covalent bonds to silicon in the silicon dioxide matrix making it more resistant to a dilute HF acid chemistry, an etching chemistry that is commonly employed in semiconductor manufacturing operations for many reasons. After the etch-resistant regions 36A are formed, a moderate temperature anneal, e.g., 600-900° C., is then performed to cause the formation of Si—C or Si—Si bonds.

Figure 1K:
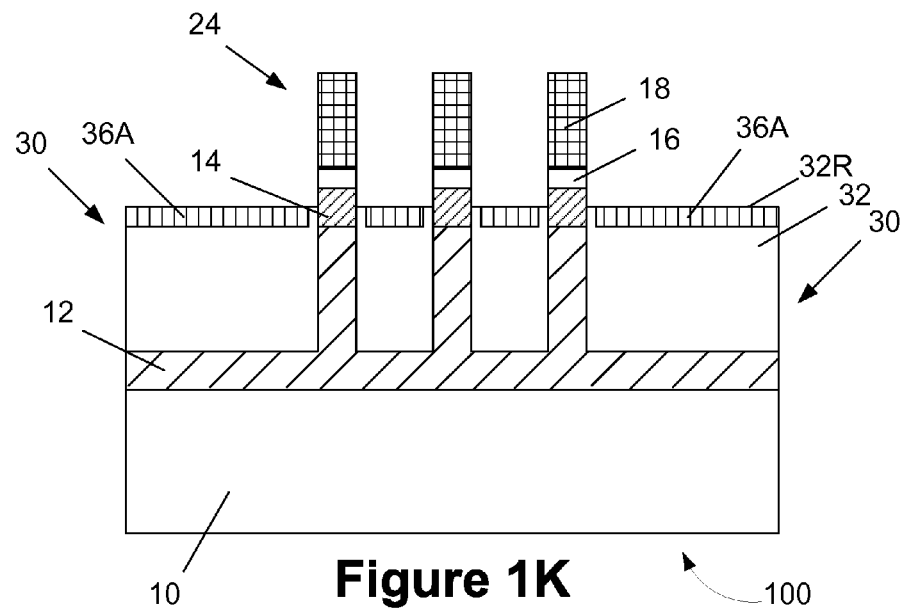

FIG. 1K depicts the device after the hard mask 20 and the spacers 34 have been removed. The resulting device 100 has undoped fins 24 that exhibit good fin height uniformity and etch-resistant regions 36A in the insulating material 32 that will reduce or eliminate loss of isolation material.

Figure 1L:
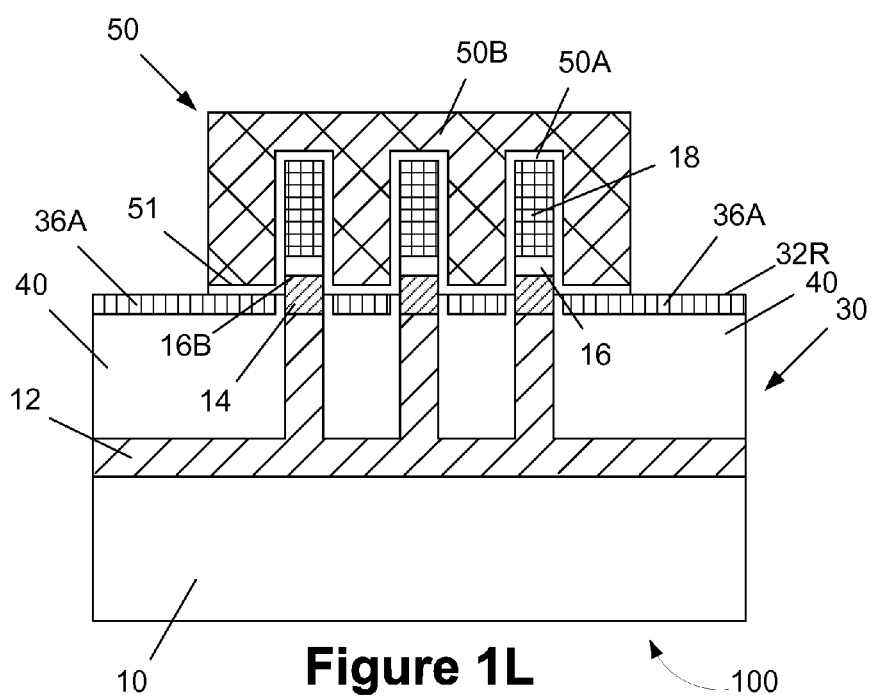

As shown in FIG. 1L, a gate electrode structure 50 is formed for the FinFET device 100. The schematically depicted gate structure 50 includes an illustrative gate insulation layer 50A and an illustrative gate electrode 50B. Also note that the gate electrode 50B should be positioned such that its bottom surface 51 is at a level that is below or approximately level with, i.e., coincides with, the bottom 16B of the doped semiconducting material 16. An illustrative gate cap layer (not shown) may also be formed above the illustrative gate electrode 50B. As will be recognized by those skilled in the art after a complete reading of the present application, the gate structure 50 of the device 100 depicted in the drawings, i.e., the gate insulation layer 50A and the gate electrode 50B, is intended to be representative in nature. For example, the gate insulation layer 50A may be comprised of a variety of different materials, such as, for example, silicon dioxide, a so-called high-k (k greater than 10) insulation material (where k is the relative dielectric constant), etc. The gate electrode 50B may be comprised or one or more layers of conductive material, e.g., polysilicon, one or more layers of metal, etc. The gate structure 50 may be formed using either "gate-first" or "replacement-gate" techniques. At this point, traditional manufacturing techniques may be performed to complete the manufacture of the device 100.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A FinFET device, comprising:
   a plurality of fin structures positioned in and above a semiconducting substrate, each of said plurality of fin structures comprising:
      a first portion of said semiconducting substrate;
      an undoped layer of semiconducting material positioned above said first portion of said semiconducting substrate; and
      a dopant-containing layer of semiconducting material positioned between said first portion of said semiconducting substrate and said undoped layer of semiconducting material, wherein said dopant-containing layer of semiconducting material is adapted to retard diffusion of one of boron and phosphorous; and
   a gate electrode positioned around at least said undoped layer of semiconducting material comprising each of said plurality of fin structures, wherein a height level of a bottom surface of said gate electrode is positioned approximately level with or lower than a height level of a bottom of said undoped layer of semiconducting material comprising each of said plurality of fin structures.

2. The FinFET device of claim 1, wherein each of said plurality of fin structures further comprise a punch-stop implant region positioned in a second portion of said semiconducting substrate above said first portion of said semiconducting substrate and below said dopant-containing layer of semiconducting material.

3. The FinFET device of claim 2, wherein said dopant-containing layer of semiconducting material is positioned in a third portion of said semiconducting substrate.

4. The FinFET device of claim 2, wherein said dopant-containing layer of semiconducting material is a layer of semiconducting material positioned on said second portion of said semiconducting substrate.

5. The FinFET device of claim 2, wherein a dopant material comprising said dopant-containing layer of semiconducting material comprises at least one of carbon and germanium.

6. The FinFET device of claim 2, wherein said first portion of said semiconducting substrate and said punch-stop implant region comprise a same type of dopant material, said same type of dopant material having one of an N-type conductivity and a P-type conductivity.

7. The FinFET device of claim 6, wherein said punch-stop implant region has a higher dopant concentration of said same type of dopant material than said first portion of said semiconducting substrate.

8. The FinFET device of claim 2, further comprising an insulating material positioned between and laterally adjacent to at least a portion of each of said plurality of fin structures, wherein a height level of an upper surface of said insulating layer is lower than said height level of said bottom of said gate electrode.

9. The FinFET device of claim 8, wherein said insulating material covers sidewalls of said first portion of said semiconducting substrate comprising each of said plurality of fin structures and covers a lower sidewall portion of said punch-stop implant region comprising each of said plurality of fin structures but does not cover an upper sidewall portion of said punch-stop implant region.

10. The FinFET device of claim 9, wherein an upper surface portion of said insulating material positioned laterally adjacent to said lower sidewall portion of said punch-stop implant region comprising each of said plurality of fin structures is one of a silicon-rich insulating material and a carbon-rich insulating material.

11. A FinFET device, comprising:
   a plurality of fin structures positioned in and above a semiconducting substrate, each of said plurality of fin structures comprising:
      a first fin portion;
      a second fin portion positioned on said first fin portion, each of said first and second fin portions comprising a first semiconducting material and a first dopant material having a first conductivity type, wherein a first concentration of said first dopant material in said first fin portion is lower than a second concentration of said first dopant material in said second fin portion;
      a third fin portion positioned above said second fin portion, said third fin portion comprising a second semiconducting material and a second dopant material, wherein said second dopant material is adapted to retard diffusion of at least one of boron and phosphorous; and
      a fourth fin portion positioned on said third fin portion, said fourth fin portion comprising an undoped third semiconducting material; and a gate electrode structure positioned around at least a portion of each of said plurality of fin structures, said gate electrode structure comprising:
  a gate insulation layer; and
  a gate electrode positioned on said gate insulation layer, wherein a height level of a bottom surface of said gate electrode structure is positioned no higher than a height level of a bottom of said third fin portions of each of said plurality of fin structures.

12. The FinFET device of claim 11, wherein said height level of said bottom surface of said gate electrode is positioned lower than said height level of said bottom of said third fin portions of each of said plurality of fin structures.

13. The FinFET device of claim 11, wherein said second dopant material is one of carbon and germanium.

14. The FinFET device of claim 11, wherein said second dopant material is carbon having a concentration in said second semiconducting material that is greater than approximately 2%.

15. The FinFET device of claim 11, further comprising an insulating layer positioned between and laterally adjacent to each of said plurality of fin structures, wherein a lower layer portion of said insulating layer is positioned between and laterally adjacent to said first fin portions of each of said plurality of fin structures and an upper layer portion of said insulating layer is positioned between and laterally adjacent to said second fin portions of each of said plurality of fin structures, said upper layer portion of said insulating layer comprising a third dopant material that is not present in said lower layer portion of said insulating layer.

16. The FinFET device of claim 15, wherein a thickness of said upper layer portion of said insulating layer is in the range of approximately 10-20 nm.

17. The FinFET device of claim 15, wherein said insulating layer comprises a silicon dioxide material and said third dopant material has a concentration in said silicon dioxide material of said upper layer portion of said insulating layer that ranges from approximately 10-20%.

18. The FinFET device of claim 17, wherein said upper layer portion of said insulating layer is one of a carbon-rich silicon dioxide material and a silicon-rich silicon dioxide material.

19. The FinFET device of claim 11, wherein said first and second fin portions comprise a portion of said semiconducting substrate.

20. The FinFET device of claim 11, wherein said first, second and third fin portions comprise a portion of said semiconducting substrate.

* * * * *